US007133818B2

(12) United States Patent
Bierman et al.

(10) Patent No.: US 7,133,818 B2
(45) Date of Patent: Nov. 7, 2006

(54) METHOD AND APPARATUS FOR ACCELERATED POST-SILICON TESTING AND RANDOM NUMBER GENERATION

(75) Inventors: Keith H. Bierman, San Jose, CA (US); David R. Emberson, Santa Cruz, CA (US); Liang T. Chen, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 617 days.

(21) Appl. No.: 10/417,765

(22) Filed: Apr. 17, 2003

(65) Prior Publication Data

US 2004/0210431 A1    Oct. 21, 2004

(51) Int. Cl.
*G06F 17/50* (2006.01)
(52) U.S. Cl. ............................ 703/17; 703/14; 703/15; 702/117; 702/119; 702/120; 716/4
(58) Field of Classification Search ............... 713/169, 713/176; 714/733–734, 718, 726, 33, 742; 380/44; 702/120
See application file for complete search history.

(56) References Cited

U.S. PATENT DOCUMENTS

| | | | |
|---|---|---|---|
| 5,923,836 A * | 7/1999 | Barch et al. ................... 714/33 |
| 6,009,256 A | 12/1999 | Tseng et al. | |
| 6,272,451 B1 | 8/2001 | Mason et al. | |
| 6,295,623 B1 | 9/2001 | Lesmeister et al. ......... 714/741 |
| 6,975,956 B1 * | 12/2005 | Chang et al. ................ 702/120 |
| 6,993,694 B1 * | 1/2006 | Kapur et al. ................. 714/733 |
| 2001/0016927 A1 * | 8/2001 | Poisner ........................ 714/718 |
| 2001/0034866 A1 * | 10/2001 | Barry et al. ................. 714/734 |
| 2003/0229834 A1 * | 12/2003 | Cooke ......................... 714/726 |
| 2004/0059536 A1 * | 3/2004 | Chang et al. ................ 702/120 |
| 2004/0086117 A1 * | 5/2004 | Petersen et al. ............... 380/44 |
| 2005/0010778 A1 * | 1/2005 | Walmsley .................... 713/176 |
| 2005/0066168 A1 * | 3/2005 | Walmsley .................... 713/169 |
| 2005/0154948 A1 * | 7/2005 | Dervisoglu et al. ......... 714/726 |
| 2005/0268196 A1 * | 12/2005 | Chang et al. ................ 714/742 |

OTHER PUBLICATIONS

UK Combined Search and Examination Report dated Jul. 7, 2004 (3 pgs.).
Hayes, John, "Transistion Count of Combinational Logic Circuit", Jun. 1976, IEEE Transactions on Computers, vol. C-25, No. 6, pp. 613-620.

* cited by examiner

*Primary Examiner*—Kamini Shah
*Assistant Examiner*—Cuong Van Luu
(74) *Attorney, Agent, or Firm*—Osha Liang LLP (57) ABSTRACT

A method of providing accelerated post-silicon testing for a silicon hardware includes computing a simulation cumulative record of state using a plurality of test instructions and a cycle breakpoint, performing a simulation of an instrumented logic design using the plurality of test instructions and the cycle breakpoint, manufacturing the silicon hardware using the instrumented logic design, computing a silicon cumulative record of state by executing the plurality of instructions using the silicon hardware; and comparing the simulation cumulative record of state to the silicon cumulative record of state.

20 Claims, 7 Drawing Sheets

METHOD AND APPARATUS FOR ACCELERATED POST-SILICON TESTING AND RANDOM NUMBER GENERATION

BACKGROUND OF INVENTION

Computing devices include silicon hardware, e.g., a Central Processing Unit (CPU), an Arithmetic Logic Unit (ALU), Integrated Circuits (ICs), an Application Specific Integrated Circuit (ASIC), a memory controller, etc. The manufacturing of the silicon hardware is often based on highly complex logic designs. The manufacture of silicon hardware typically requires verification of the logic design through testing in order to verify that the circuits within the silicon hardware are designed properly. Also, once the verified logic design is used to build the silicon hardware, the newly manufactured silicon hardware is validated through one or more tests in order to enhance manufacturing quality. Thus, the silicon hardware undergoes both pre-silicon and post-silicon testing.

Figure 1:
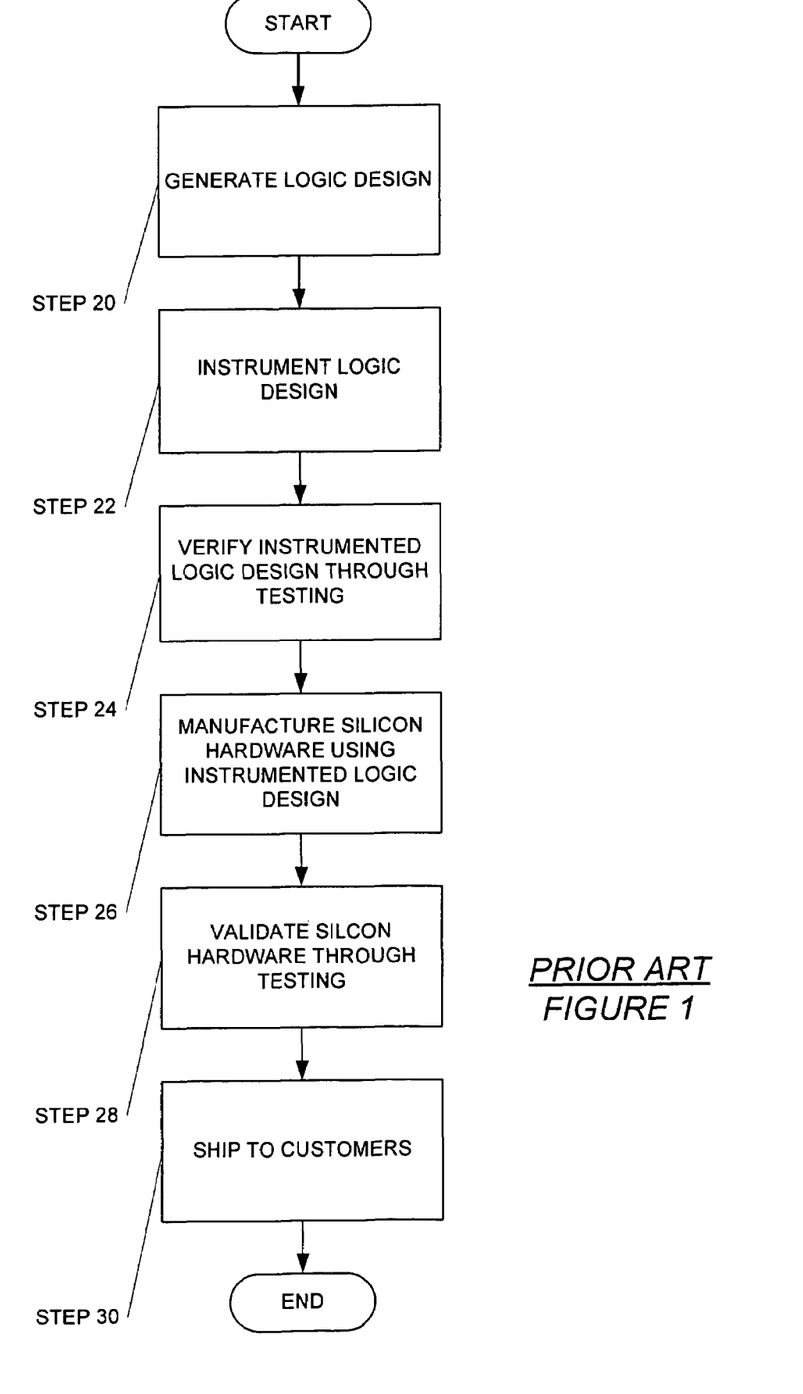
FIG. 1 shows a flowchart including typical operations involved with manufacture of silicon hardware.

FIG. 1 shows a flowchart including typical operations involved with manufacture of silicon hardware. A first operation includes generating a logic design for the silicon hardware (Step 20). The logic design may be written in a Hardware Definition Language (e.g., Verilog), and may be written at a particular level of abstraction, e.g., at gate level, where individual gates (such as AND gates) are detailed, or at Register Transfer Level (RTL). Then, the logic design is instrumented (Step 22). The instrumentation added to the logic design enables testing to obtain values of some or all of the state elements of the logic design and silicon hardware for testing purposes. For example, the logic design may include an AND gate, and the value of the output of the AND gate may be of interest at a particular point during testing. Therefore, the instrumentation may be used to obtain the value of that particular state element during testing, both in pre-silicon and post-silicon testing.

Then, the instrumented logic design is verified through testing (Step 24). For example, two versions of the instrumented logic design may be simulated on two different simulators, where one version of the instrumented logic design has already been verified as correct. Simulations may be cycle-by-cycle, or may be event-driven. In a cycle-by-cycle simulation, values of state elements may vary from cycle to cycle, depending on the stimuli used during the test. For example, in the span of 5 cycles, the value of a particular AND gate output may alternate between "1" and "0." Thus, if the AND gate is instrumented, the values of the AND gate output for the 5 cycles may be the following sequence of numbers: "01010."

Then, once the instrumented logic design is verified through testing, the silicon hardware is manufactured using the instrumented logic design (Step 26). Manufacture of the silicon hardware may take place some time after, and/or at a different location from when and where the instrumented logic design was tested. Once the silicon hardware has been manufactured, the silicon hardware is validated through testing (discussed in more detail below) (Step 28), and then shipped to various customers (Step 30).

Validation of the newly manufactured silicon hardware may be implemented via multiple mechanisms. For example, the silicon hardware may execute a program that includes test instructions designed to "more or less" exhaustively exercise each functional unit of the silicon hardware. However, instrumenting enough of the state elements of the silicon hardware in order to read enough values of state elements may be a challenge in complex silicon hardware. Scan chaining is one technique used to obtain values of state elements that may be hidden during testing.

Figure 2:
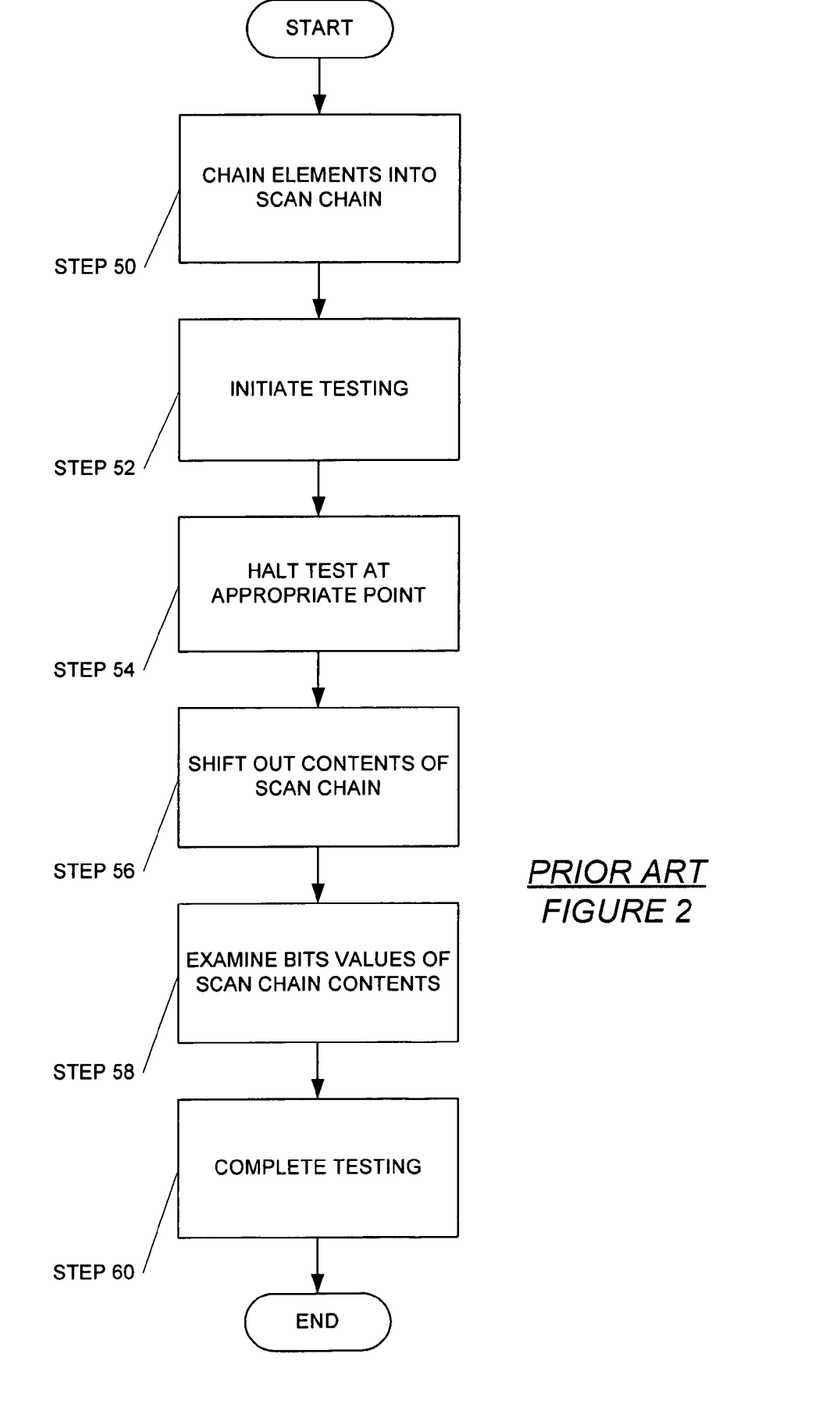
FIG. 2 shows a flowchart including operations involved with scan chaining.

FIG. 2 shows a flowchart including operations used in scan chaining. A first step includes chaining together selected state elements of the silicon hardware into one or more scan chains (Step 50). For example, the scan chains may be logical networks of flip-flops, which can be stimulated during testing. Then, testing is initiated (Step 52). At one or more appropriate points during testing, the test is halted (Step 54), and the contents of the scan chain shifted out (Step 56). The values of state elements are the contents of the scan chain.

A varying period of time may be required in order to shift out the contents of the scan chain, depending on implementation. For example, it may require 1 millisecond to shift out 5000 state element values at 100 MHZ. Thus, if there are 50 shifts, 5 seconds may be required. Furthermore, testing using scan chains may require coordination between control of a clock for the silicon hardware, and control of a clock for the scan chain.

Once the contents of the scan chain(s) are shifted out, the bit values (i.e., "1" or "0" of the state elements) are examined (Step 58). Testing is then completed (Step 60). Those skilled in the art will appreciate that validation of silicon hardware through testing is generally an iterative process, and that the process shown in FIG. 2 may be performed multiple times, with, or without additional steps.

Even after the silicon hardware has been shipped to customers, testing may not be complete. Many computing devices that include the silicon hardware requires execution of diagnostic tests during initial boot up. The diagnostic tests typically check silicon hardware components, such as checking memory circuits for faults. Often, even powerful computer systems are "resource poor" during the early phases of booting up.

To conserve resources during boot up, most diagnostic tests are self-checking. During the self-checking tests, diagnostic test results are typically computed using two different implementations, and then a test result is determined from comparing results from the two different implementations. Often, one of the implementations is significantly slower than the other implementation. In any case, the self-checking diagnostic test takes at least twice the time of the shorter implementation. It should be noted that under test conditions, computing environments may not only be resource poor, but also, time limited (i.e., only a short amount of time is allocated to running diagnostics before allowing a user access to the computer system).

SUMMARY OF INVENTION

In general, in one aspect, the invention relates to a method of providing accelerated post-silicon testing for a silicon hardware. The method comprises computing a simulation cumulative record of state using a plurality of test instructions and a cycle breakpoint, performing a simulation of an instrumented logic design using the plurality of test instructions and the cycle breakpoint, manufacturing the silicon hardware using the instrumented logic design, computing a silicon cumulative record of state by executing the plurality of instructions using the silicon hardware; and comparing the simulation cumulative record of state to the silicon cumulative record of state.

In general, in one aspect, the invention relates to a system for providing accelerated post-silicon testing for a silicon hardware. The system comprises a simulator configured to generate a simulation state value by performing a simulation of an instrumented logic design using a plurality of test instructions and a cycle breakpoint, a checksum unit configured to compute a simulation cumulative record of state using the simulation state value, a silicon hardware configured to generate a silicon cumulative record of state using the set of test instructions and the cycle breakpoint, and a silicon checksum unit configured to compute a silicon cumulative record of state using the silicon cumulative record of state.

In general, in one aspect, the invention relates to a computer system providing accelerated post-silicon testing for a silicon hardware. The computer system comprises a processor, a memory, a storage device, and software instructions stored in the memory for enabling the computer system to perform computing a simulation cumulative record of state using a plurality of test instructions and a cycle breakpoint, performing a simulation of an instrumented logic design using the plurality of test instructions and the cycle breakpoint, manufacturing the silicon hardware using the instrumented logic design, computing a silicon cumulative record of state by executing the plurality of instructions using the silicon hardware, and comparing the simulation cumulative record of state to the silicon cumulative record of state.

In general, in one aspect, the invention relates to an apparatus for providing accelerated post-silicon testing of a silicon hardware. The apparatus comprises means for computing a simulation cumulative record of state of a first value of a state element by performing a simulation of an instrumented logic design using a set of test instructions, means for manufacturing the silicon hardware using the instrumented logic design, means for generating a second value of the state element by executing the set of test instructions using the silicon hardware, means for computing a silicon cumulative record of state using the second value of the state element, and means for comparing the simulation cumulative record of state to the silicon cumulative record of state.

Other aspects and advantages of the invention will be apparent from the following description and the appended claims.

DETAILED DESCRIPTION

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 3:
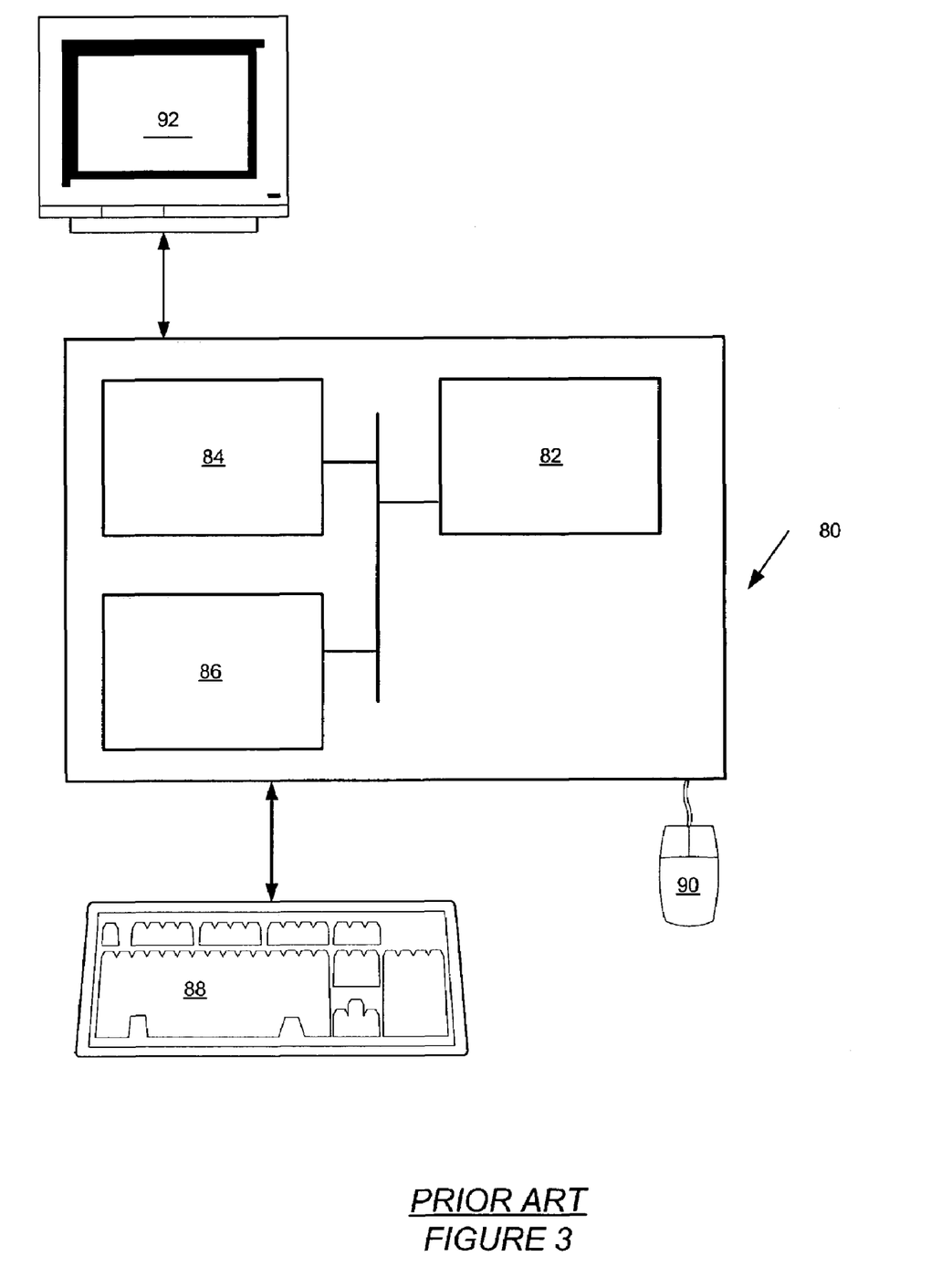
FIG. 3 shows a general purpose computer system.

The invention may be implemented on virtually any type computer regardless of the platform being used. For example, as shown in FIG. 3, a general purpose computer (80) includes a processor (82), an associated memory (84), a storage device (86), and numerous other elements and functionalities typical of today's computers (not shown). The computer (80) may also include input means, such as a keyboard (88) and a mouse (90), and an output device, such as a monitor (92). In accordance with an embodiment of the invention, the computer (80) is networked. Those skilled in the art will appreciate that these input and output means may take other forms.

One or more aspects of the invention relate to providing accelerated post-silicon testing of silicon hardware of a computing device and random number generation. In accordance with an embodiment of the invention, components included in a system for providing accelerated post-silicon testing for the silicon hardware and random number generation are shown as a flow diagram in FIG. 4. The components shown in FIG. 4 are grouped in two groups: pre-silicon components (110) and post-silicon components (112).

Figure 4:
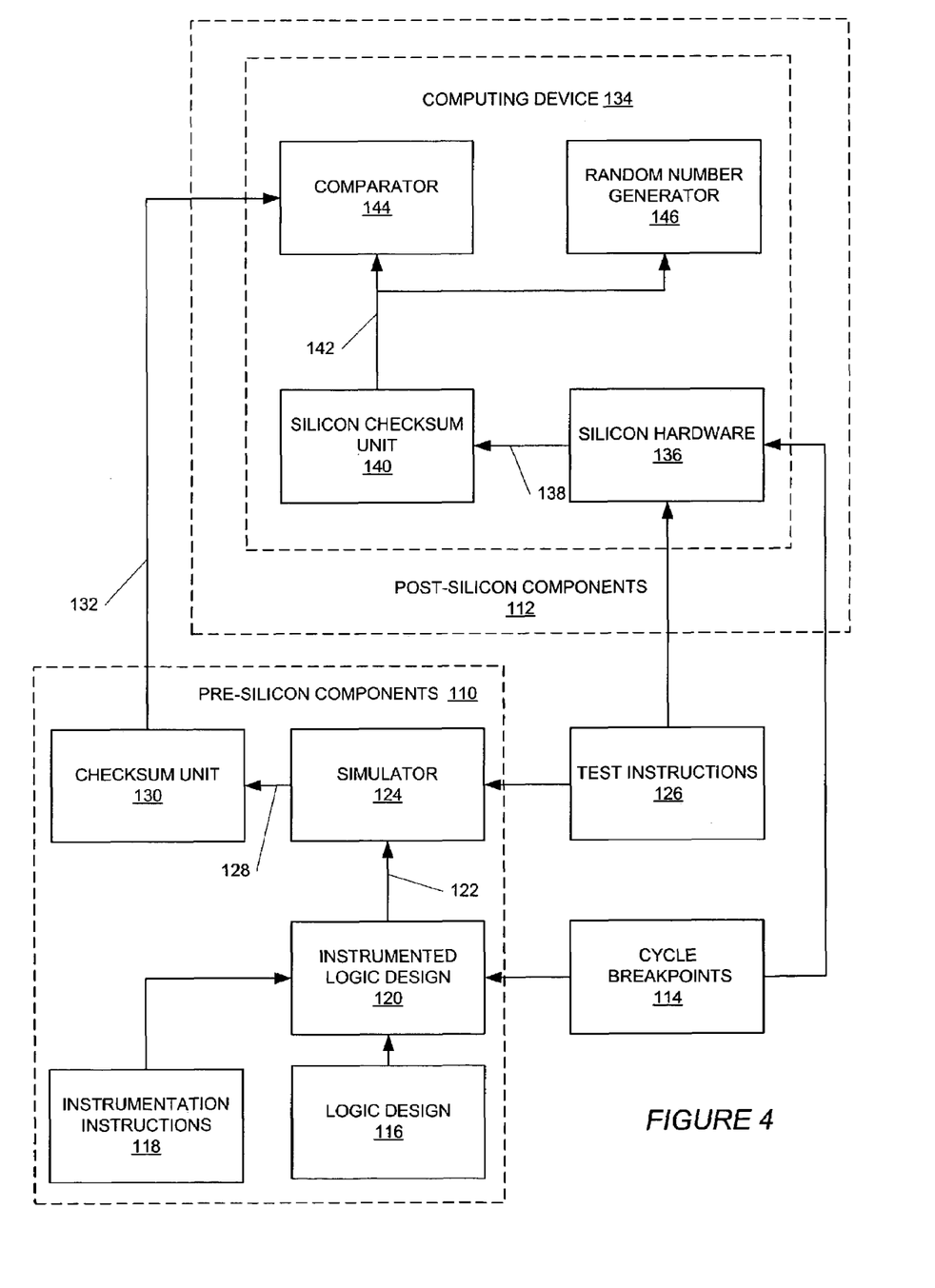
FIG. 4 shows a system for providing accelerated post-silicon testing for the silicon hardware in accordance with an embodiment of the invention.

As shown in FIG. 4, the pre-silicon components (110) include cycle breakpoints (114), a logic design (116), instrumentation instructions (118), an instrumented logic design (120), a simulation image (122), a simulator (124), a set of test instructions (126), simulation state values (128), a checksum unit (130), and a simulation cumulative record of state (132). The post-silicon components (112) include a computing device (134), which includes silicon hardware (136), silicon hardware state values (138), a silicon checksum unit (140), a silicon cumulative record of state (142), a comparator (144), and a random number generator (146).

The pre-silicon components (110) and post-silicon components (112) are not necessarily located in close conjunction to each other. For example, the pre-silicon components (110) may be located in a research lab, and the post-silicon components (112) may be located in a semiconductor manufacturing facility.

The logic design (116) and instrumentation instructions (118), along with the cycle breakpoints (114), are combined to create the instrumented logic design (120). The instrumented logic design (120) is compiled to create the simulation image (122), which is an input into the simulator (124). In accordance with an embodiment of the invention, the simulator is a cycle-accurate simulator, which is capable of modeling each aspect of a target CPU, including pipeline, cache, memory-management unit, etc.

The simulator (124) simulates the instrumented logic design (120) by executing the simulation image (122) controlled by the set of test instructions (126). Simulation state values (128) are an output of the simulator (124). For example, if an AND gate is a state element of the logic design (116), and the AND gate output is instrumented, then the value of the AND gate output at a particular point during simulation is included as output in the simulation state values (128). The simulation state values (128) are input into the checksum unit (130). At this point, a checksum operation is performed on the simulation state values (128) within the checksum unit (130) (as is further described below). The simulation cumulative record of state (132) is output from the checksum unit (130).

The post-silicon components (112) includes the computing device (134) and all necessary components and functionality to allow the computing device to operate (not shown). The computing device (134) includes the silicon hardware (136), which has been manufactured based on the instrumented logic design (120). The set of test instructions (126) and the cycle breakpoints (114) are transferred to the silicon hardware (136). In accordance with an embodiment of the invention, the set of test instructions (126) and the cycle breakpoints (114) are transferred to an appropriate form of intermediate storage, and later transferred to the silicon hardware (136) or elsewhere in the computing device (134), or otherwise made available to the silicon hardware (136).

The silicon hardware (136) outputs the silicon hardware state values (138), which is an input to the silicon checksum unit (140). The silicon checksum unit (140) performs a checksum operation on the silicon hardware state values (138) and outputs the silicon cumulative record of state (142). The silicon cumulative record of state (142) is then input to the comparator (144) and the random number generator (146).

The comparator (144) also takes input from the simulation cumulative record of state (132). In accordance with an embodiment of the invention, the simulation cumulative record of state (132) is transferred to an appropriate form of intermediate storage for later input to the comparator (144). The comparator (144) is any functional device or software program with the capability to determine whether the simulation cumulative record of state (132) equals the silicon cumulative record of state (142), and output a result of the comparison.

In accordance with an embodiment of the invention, the random number generator (146) takes as input a subset of the silicon cumulative record of state (142). The random number generator (146) includes functionality sufficient to generate a random number using the silicon cumulative record of state (142). For example, the random number generator (146) may generate random number by invoking software application programming interfaces (APIs) or system method calls(such as rand( ) and srand( )) and providing the silicon cumulative record of state (142) as seed for the API or system method.

Figure 5:
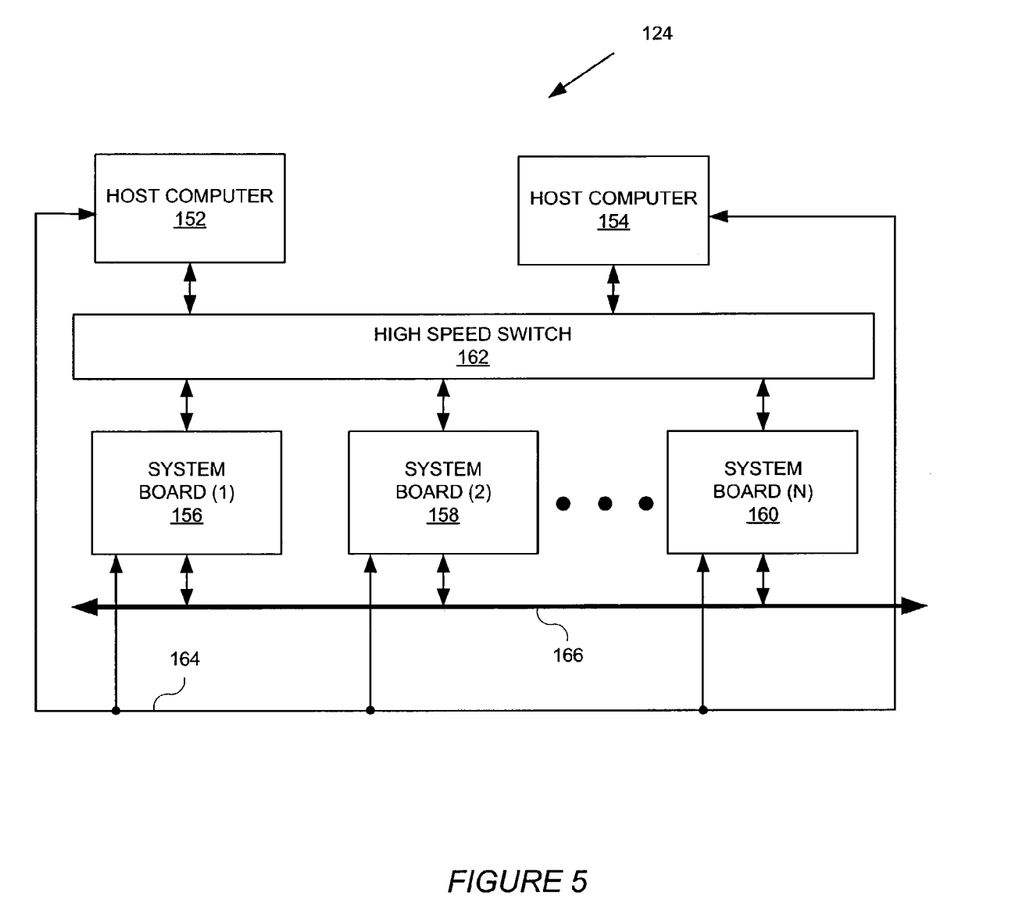
FIG. 5 shows elements of an exemplary simulator in accordance with an embodiment of the invention.

Referring back to the pre-silicon components, in accordance with an embodiment of the invention, the simulator (124) may be a software application executing on a computer, such as the general purpose computer shown in FIG. 3. Alternatively, the simulator (124) may be special purpose hardware, such as shown in FIG. 5. Referring to FIG. 5, the simulator (124) may include one or more host computers (152, 154) managing the simulation(s) executing on one or more system boards (156, 158, 160). Each system board contains one or more Application Specific Integrated Circuits (ASICs) (not shown). Each ASIC contains multiple execution processors (not shown). The host computers (152, 154) may communicate with the system boards (156, 158, 160) using one of several pathways. The host computers (152, 154) include interface hardware and software as needed to manage simulation of a logic design or an instrumented logic design.

A high-speed switch (162) connects the host computers (152, 154) to the system boards (156, 158, 160). The high-speed switch (162) is used for loading and retrieval of state information from execution processors located on ASICs on each of the system boards (156, 158, 160). The connection between the host computers (152, 154) and system boards (156, 158, 160) may include an Ethernet connection (164). The Ethernet connection (164) is used for service functions, such as loading a logic design and debugging. The system also includes a backplane (166). The backplane (166) allows the ASICs on one system board to communicate with the ASICs of another system board (156, 158, 160) without having to communicate with an embedded controller located on each system board. Additional system boards may be added to the system by connecting more system boards to the backplane (166).

Design and manufacture of the silicon hardware proceeds in two separate phases: a pre-silicon phase and a post-silicon phase. The post-silicon phase is not necessarily performed soon after the pre-silicon phase. Days, weeks, months, or even years may separate performance of the pre-silicon and post-silicon phases. Further, as previously discussed, components of the pre-silicon and post-silicon phases may exist in different locations.

Figure 6:
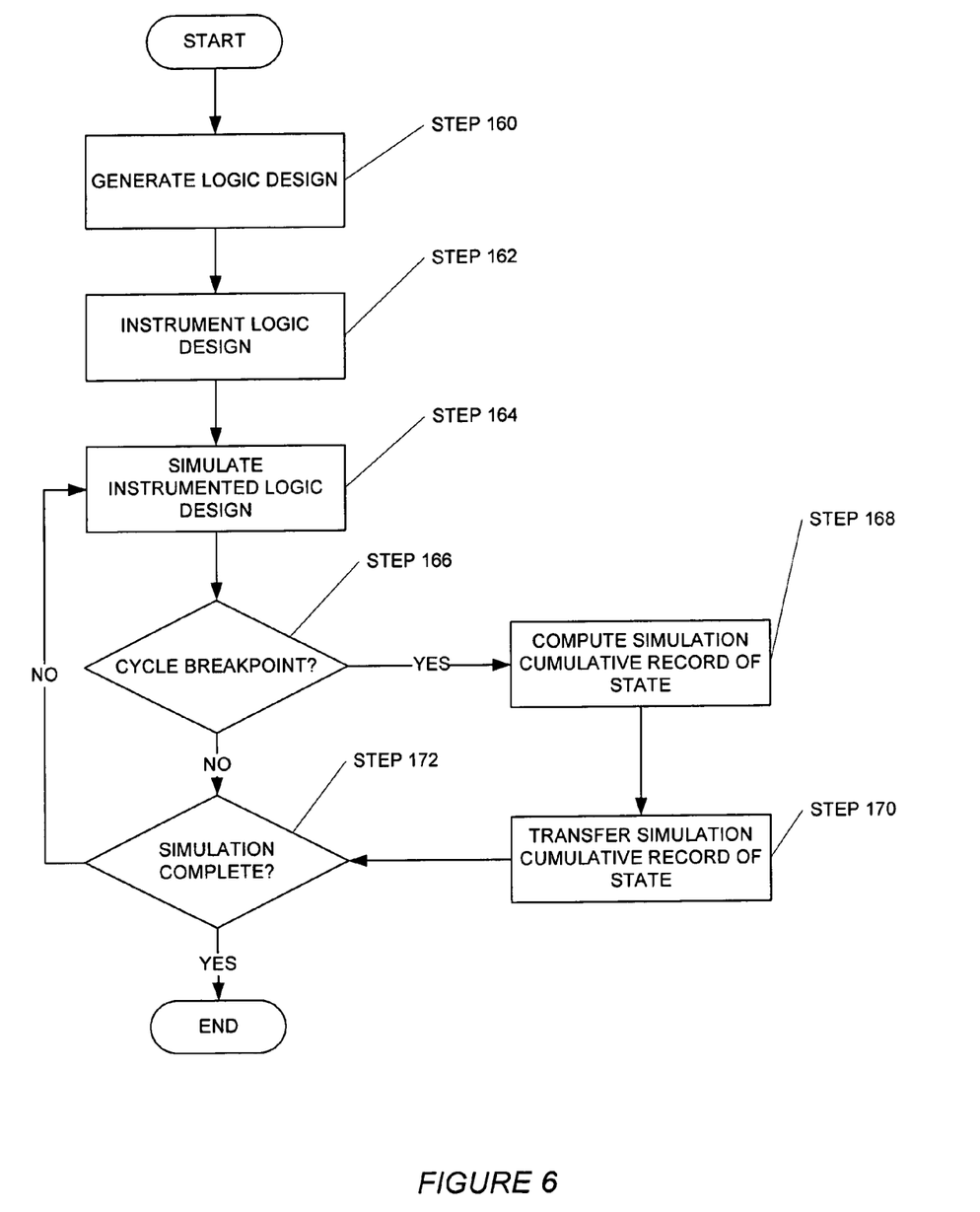
FIG. 6 shows a flowchart for pre-silicon testing of the silicon hardware in accordance with an embodiment of the invention.
Figure 7:
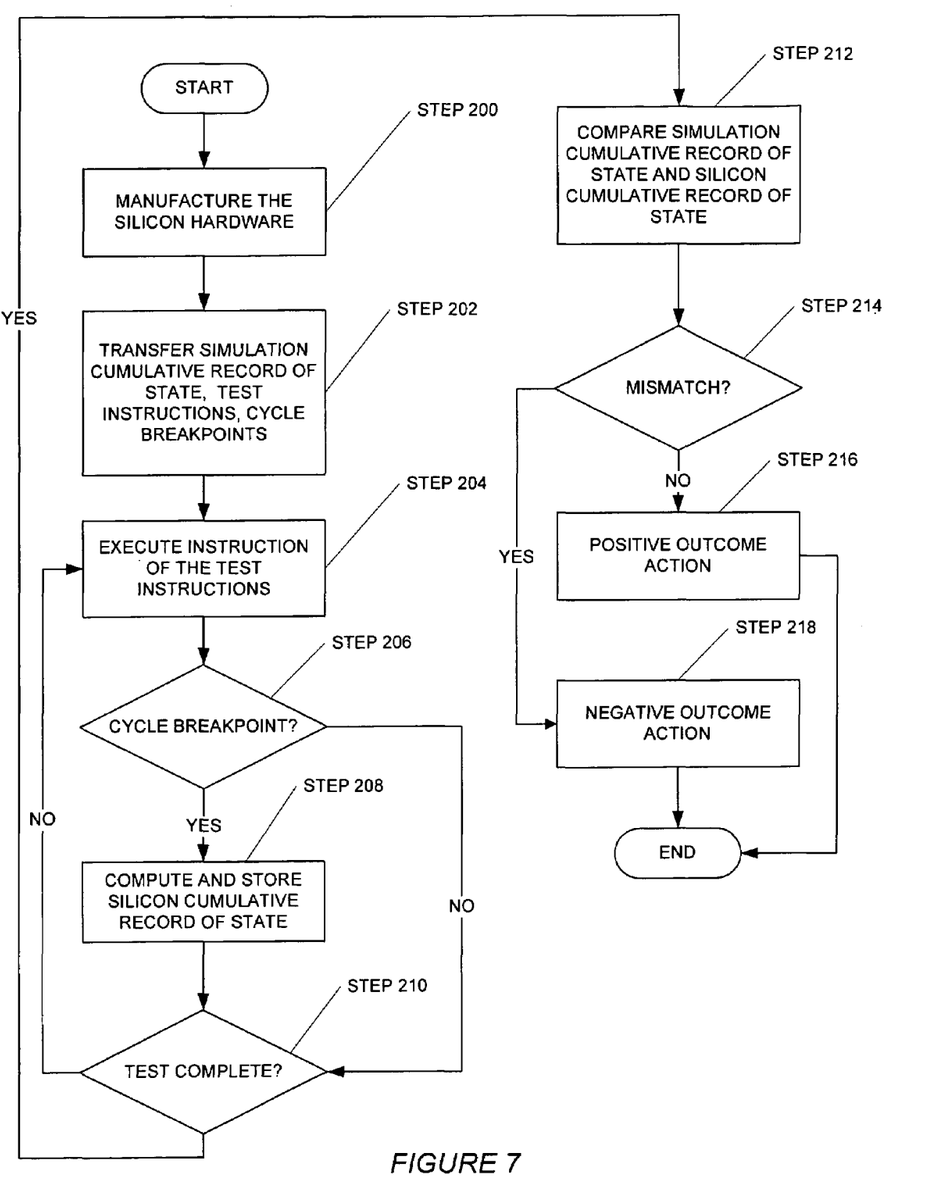
FIG. 7 shows a flowchart for post-silicon testing of the silicon hardware in accordance with an embodiment of the invention.

FIG. 6 shows a flowchart for the pre-silicon phase, and FIG. 7 shows a flowchart for the post-silicon phase. Referring to FIG. 6, a first step for the pre-silicon phase includes generating the logic design (Step 160). In addition to including instructions for simulating functionality of the silicon hardware, the logic design includes instructions required for execution of the simulation on the simulator. For example, the logic design includes instructions determining which cycles of the simulation are designated cycle breakpoints. In accordance with an embodiment of the invention, at each cycle breakpoint, the simulation cumulative record of state is computed. For example, the logic design may include instructions to have a cycle breakpoint every 1000 cycles. The logic design is, in accordance with an embodiment of the invention, written in an HDL at the RTL level.

Next, the instrumented logic design is generated by instrumenting the logic design (Step 162). In accordance with an embodiment of the invention, instrumenting is accomplished by accessing data structures of the simulation using a programming language, e.g., by use of function or method invocations. Via instrumentation, values of the simulation state elements may be obtained. For example, if the simulation of the silicon hardware includes the previously mentioned AND gate, then the output of the AND gate may be of interest to a designer of the silicon hardware. Using the instrumentation, the value of a simulation state element such as the AND gate may be obtained. Although the simulation has a total state that includes each value of each simulation state element, in accordance with an embodiment of the invention, a subset of the total state of the simulation is instrumented.

Once the logic design has been instrumented, then, for a current simulation cycle, the instrumented logic design is simulated on the simulator using the set of test instructions and the cycle breakpoints (Step 164). In accordance with an embodiment of the invention, the set of test instructions are a program executed by the simulator using the instrumented logic design. For example, referring to the previous example, if the instrumented logic design includes an AND gate, which has two inputs, and the output of the AND gate is a simulation state element that is instrumented, the set of test instructions may cause two inputs of value "1" to be placed on the two inputs of the AND gate. Thus, for a particular cycle, a "1" value may be measured via instrumentation for the simulation state element, namely, the output of the AND gate. Thus, the functionality of the AND gate is simulated by the simulator.

Once the current simulation cycle has been simulated, a determination is made as to whether the current simulation cycle is a cycle breakpoint (Step 166). If the current simulation cycle is a cycle breakpoint, then a simulation cumulative record of state is computed (Step 168). In accordance with an embodiment of the invention, the simulation cumulative record of state is a form of hash function, such as a checksum, which is often used for cryptographic applications, and also in many other applications used on computer systems.

A checksum, when implemented with an appropriate algorithm, may be used to determine whether one number that represents a message is different from another number, which represents another message. For example, the sequence of numbers "12345" may represent a first message, and the sequence of numbers "21345" may represent a second message. When a checksum algorithm takes as input both sequences of numbers, two different resulting checksums are computed because of the reversal of the "1" and the "2" in "12345" and "21345."

The checksum unit computes the simulation cumulative record of state using values of state elements that have been instrumented. For example, if the AND gate output is instrumented, then the value of the AND output may change over a span of cycles. For example, from cycle 1 to cycle 5, the value of the AND gate output may alternate between "0" and "1," thereby generating a sequence of numbers, such as "01010." Thus, a checksum of the sequence of numbers ("01010") may be computed using the checksum unit. Those skilled in the art will appreciate that more than one state element may be used to compute the simulation cumulative record of state. For example, there may be hundreds, or even thousands, of state elements used to compute the simulation cumulative record of state.

Moreover, with use of an appropriate checksum algorithm (similar to the many already widely used in industry today), differing sequences of values of simulation state elements provide different values of checksums. The simulation cumulative record of state is computed using sequences of numbers, which are measurements of values of state elements. For example, over the span of 5 simulation cycles (i.e., cycle 1 to cycle 5), the output of the previously-mentioned AND gate, if instrumented and measured, may produce a sequence equal to "10101." A checksum is computed using "10101" as input, may equal a particular value, e.g., "43533." However, if the output of the AND gate over the span of the 5 cycles instead equals "00100," instead of "10101," then the checksum, if using an appropriate algorithm, will produce a value different from "43533." Because differing sequences of values of simulation state elements produce different values of checksums, different values of simulation cumulative records of state indicate different simulation states over a span of simulation cycles.

The simulation cumulative record of state is "cumulative" because each successive computation of the simulation cumulative record of state takes as input not only values of state elements for the current simulation cycle, but also the value of the previously computed simulation cumulative record of state (from the previous cycle breakpoint). Referring to the previous example, the sequence of measured AND outputs of "10101" may represent 5 measurements of the output of the AND gate at five sequential simulation cycles, where each of the 5 simulation cycles is a cycle breakpoint. Alternatively, the 5 measurements may have been taken over a span of 5000 cycles, where each $1000^{th}$ cycle is a cycle breakpoint. Thus, the simulation cumulative record of state is cumulative over whatever span of cycles is used for measuring state elements values.

Once the cumulative simulation record of state has been computed, the simulation cumulative record of state is transferred (or stored) (Step 170). For example, the simulation cumulative record of state may be transferred to Random Access Memory (RAM), or transferred to secondary storage (e.g., as a file on a hard drive disk).

Then, a determination is made as to whether the simulation has ended (Step 172). If the simulation has not ended, then Steps 164–172 are repeated until the simulation has ended.

Once the pre-silicon phase as shown in FIG. 6 is complete, then the post-silicon phase of the flowchart in FIG. 7 may be performed. The post-silicon phase of testing need not be performed immediately after the pre-silicon phase of testing. Often, the post-silicon phase is performed months after the pre-silicon phase, and often in a different location.

Referring to FIG. 7, a first step for the post-silicon phase includes manufacturing the silicon hardware using the instrumented logic design (Step 200). The silicon hardware of the computing device is based on the instrumented logic design. For example, the instrumented logic design may include a particular circuit module that includes a series of AND gates, OR gates, etc. Thus, the silicon hardware will also include the series of AND gates, OR gates, etc.

Next, the simulation cumulative record of state, the set of test instructions, and the cycle breakpoints are transferred to an area on, or accessible to, the silicon hardware of the computing device (Step 202). For example, the silicon hardware or the computing device may include RAM, Read Only Memory (ROM), or Programmable Read Only Memory (PROM), etc., on which the simulation cumulative record of state, the set of test instructions, and the cycle breakpoints are located.

Next, testing of the silicon hardware is initiated by selecting and executing an instruction of the set of test instructions by the silicon hardware (Step 204). In accordance with an embodiment of the invention, the silicon checksum unit is set to zero when the test begins.

A determination is then made as to whether a cycle breakpoint is set for the current instruction (Step 206). The cycle breakpoints are used to determine whether a cycle breakpoint is set for the current instruction. If a cycle breakpoint is set for the current instruction, a silicon cumulative record of state is computed and stored (Step 208).

In accordance with an embodiment of the invention, the silicon cumulative record of state is computed in the same manner as the simulation cumulative record of state is computed using a hash function (e.g., a checksum), which takes as input, values of silicon state elements (i.e., state elements of the silicon hardware). In accordance with an embodiment of the invention, the silicon state elements that are instrumented are a subset of a total state of the silicon hardware.

Then, after computing and storing (and/or displaying) the silicon cumulative record of state, or, if no cycle breakpoint is set for the current instruction, a determination is made as to whether the test has completed execution (Step 210). If the test has not completed execution, then Step 204–210 are performed until the test has completed execution. Otherwise, if the test has completed, then the simulation cumulative record of state stored on (or accessible to) the computing device is compared to the silicon cumulative record of state using a comparator (Step 212). The comparator determines whether a mismatch exists between a value of the simulation cumulative record of state and a value of the silicon cumulative record of state (Step 214).

If no mismatch exists between the value of the simulation cumulative record of state and the value of the silicon cumulative record of state, then, in accordance with an embodiment of the invention, a positive outcome action is taken (Step 216). For example, a display device accessible to the computing device may display a message indicating that post-silicon testing has been performed with a positive outcome. Otherwise, a mismatch does exist, and, in accordance with an embodiment of the invention, a negative outcome action is taken (Step 218). For example, a display device accessible to the computing device may display a message indicating that post-silicon testing has been performed with a negative outcome.

In accordance with an embodiment of the invention, the test shown in FIG. 7 may be performed at a semiconductor manufacturing facility, and upon satisfactory completion of the test (and possibly other testing), the computing device may be shipped to customers. Also, because the set of test instructions, the cycle breakpoints, and the simulation cumulative record of state are stored in, on, or accessible to, the computing device, the test may be performed by the customer when needed or desired. For example, the test shown in FIG. 7 may be performed on boot-up of the computing device, or by service technicians diagnosing problems with the silicon hardware.

In the software industry, approaches to generate random numbers vary. For example, some operating systems, such as Linux, store data from external events, such as mouse movements and keystrokes, and extract information from these events. The extracted information is stored in an entropy pool. The entropy pool includes bit values that are random. Other random number generators based on hardware are also available. For example, an alpha particle emitter may be used to generate random numbers.

In accordance with an embodiment of the invention, the random number generator is a software application executing on the computing device, and under programmatic control by the computing device (or by software executing on the computing device). In accordance with an embodiment of the invention, the random number generator reads a value of the silicon cumulative record of state from the silicon checksum unit, and uses the value of the silicon cumulative record of state to generate a random number. For example, the value of the silicon cumulative record of state may be passed as a seed value to an executing software program via a method or an API, which generates the random number.

Advantages of various embodiments of the present invention may include one or more of the following. Post-silicon testing of silicon hardware of the computing device may be enhanced with respect to time and quality because the silicon cumulative record of state and the simulation cumulative record of state represent, with a sufficiently high degree of confidence, the internal states of the simulator and the silicon hardware. The probability of the silicon cumulative record of state and the simulation cumulative record of state checksums being equal, but still being the result of different state history, is sufficiently low as to yield the high degree of confidence. Thus, quality and reliability of the silicon hardware of the computing device may be tested.

Further, the present invention provides random number generation using computing functionality of the computing device. Thus, extraneous, additional functionality (e.g., alpha particle generators, etc.) or hardware not essential to the computing device itself is not required in order to generate random numbers.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of providing accelerated post-silicon testing for a silicon hardware, comprising:
   computing a simulation cumulative record of state using a plurality of test instructions and a cycle breakpoint;
   performing a simulation of an instrumented logic design using the plurality of test instructions and the cycle breakpoint;
   manufacturing the silicon hardware using the instrumented logic design;
   computing a silicon cumulative record of state by executing the plurality of instructions using the silicon hardware;
   comparing the simulation cumulative record of state to the silicon cumulative record of state; and
   outputting a result of comparing the simulation cumulative record of state to the silicon cumulative record of state, wherein outputting comprises displaying a message based on the result,
   wherein computing the simulation cumulative record of state uses a first output value and a second output value of a simulation state element.

2. The method of claim 1, further comprising:
   generating a random number using the silicon cumulative record of state.

3. The method of claim 2, further comprising:
   providing the random number to a computer program executing on a computer device.

4. The method of claim 1, further comprising:
   transferring the set of test instructions, the cycle breakpoint, and the simulation cumulative record of state to a storage area accessible to the silicon hardware; and
   generating the instrumented logic design by instrumenting a logic design.

5. The method of claim 4, wherein the cycle breakpoint is used to determine when computing the silicon cumulative record of state is performed.

6. The method of claim 1, wherein computing the simulation cumulative record of state comprises:
   computing a checksum using an output value of a state element of the simulation.

7. The method of claim 1, wherein computing the silicon cumulative record of state comprises:
   computing a checksum using an output value of a state element of the silicon hardware.

8. The method of claim 1, wherein the simulation cumulative record of state is a subset of a total state of the simulation.

9. The method of claim 1, wherein the silicon cumulative record of state is a subset of a total state of the silicon hardware.

10. The method of claim 1, wherein the simulation cumulative record of state is computed in association with a predetermined cycle breakpoint of a plurality of cycles of the simulation.

11. The method of claim 10, wherein the simulation is executed on a cycle-accurate simulator.

12. A system for providing accelerated post-silicon testing for a silicon hardware, comprising:
- a simulator configured to generate a simulation state value by performing a simulation of an instrumented logic design using a plurality of test instructions and a cycle breakpoint;
- a checksum unit configured to compute a simulation cumulative record of state using the simulation state value;
- a silicon hardware configured to generate a silicon cumulative record of state using the set of test instructions and the cycle breakpoint; and
- a silicon checksum unit configured to compute a silicon cumulative record of state using the silicon cumulative record of state,
- wherein computing the silicon cumulative record of state uses a first output value and a second output value of a state element of the silicon hardware.

13. The system of claim 12, further comprising:
- a comparator configured to compare a value of the silicon cumulative record of state and a value of the simulation cumulative record of state;
- a logic design and instrumentation instructions used to generate the instrumented logic design.

14. The system of claim 12, wherein the silicon hardware is manufactured using the instrumented logic design.

15. The system of claim 12, wherein the cycle breakpoint is used to determine when the silicon cumulative record of state is computed.

16. The system of claim 12, further comprising:
- a random number generator configured to use the silicon cumulative record of state to generate a random number.

17. A computer system providing accelerated post-silicon testing for a silicon hardware, comprising:
- a processor;
- a memory;
- a storage device; and
- software instructions stored in the memory for enabling the computer system to perform:
  - computing a simulation cumulative record of state using a plurality of test instructions and a cycle breakpoint;
  - performing a simulation of an instrumented logic design using the plurality of test instructions and the cycle breakpoint;
  - manufacturing the silicon hardware using the instrumented logic design;
  - computing a silicon cumulative record of state by executing the plurality of instructions using the silicon hardware; and
  - comparing the simulation cumulative record of state to the silicon cumulative record of state,
  - wherein computing the simulation cumulative record of state uses a first output value and a second output value of a simulation state element.

18. The computer system of claim 17, further comprising software instructions to perform:
- generating a random number using the silicon cumulative record of state.

19. The computer system of claim 17, further comprising software instructions to perform:
- transferring the set of test instructions, the cycle breakpoint, and the simulation cumulative record of state to a storage area accessible to the silicon hardware;
- generating the instrumented logic design by instrumenting a logic design; and
- outputting the result of comparing the simulation cumulative record of state to the silicon cumulative record of state.

20. An apparatus for providing accelerated post-silicon testing of a silicon hardware, comprising:
- means for computing a simulation cumulative record of state of a first value of a state element by performing a simulation of an instrumented logic design using a set of test instructions;
- means for manufacturing the silicon hardware using the instrumented logic design;
- means for generating a second value of the state element by executing the set of test instructions using the silicon hardware;
- means for computing a silicon cumulative record of state using the second value of the state element; and
- means for comparing the simulation cumulative record of state to the silicon cumulative record of state,
- wherein computing the simulation cumulative record of state uses a first output value and a second output value of a simulation state element.

* * * * *